SIMULTANEOUS ETCHING AND MONITORING OF SEMICONDUCTOR BODIES

Filed Dec. 24, 1959 2 Sheets-Sheet 1

INVENTORS
J. J. FRY
C. C. GINGRICH JR.
BY S. Gundersen
ATTORNEY

SIMULTANEOUS ETCHING AND MONITORING OF SEMICONDUCTOR BODIES

Filed Dec. 24, 1959 2 Sheets-Sheet 2

INVENTORS
J.J. FRY
C. C. GINGRICH JR.

BY S. Gundersen
ATTORNEY

United States Patent Office 3,192,141
Patented June 29, 1965

3,192,141

SIMULTANEOUS ETCHING AND MONITORING OF SEMICONDUCTOR BODIES

John J. Fry, Bethlehem, and Carl C. Gingrich, Jr., Emmaus, Pa., assignors to Western Electric Company, Incorporated, New York, N.Y., a corporation of New York Filed Dec. 24, 1959, Ser. No. 861,795
3 Claims. (Cl. 204—143)

The present invention relates to the etching of semiconductor bodies having PN junctions and more particularly to methods of etching such bodies to remove shorting material from the junctions thereof, while simultaneously monitoring the effect of the etching.

In the production of semiconductor wafers for semiconductor devices, it is sometimes necessary to chemically or electrolytically etch the wafer surface. For example in some types of silicon rectifiers, in which the electronic junction (the PN junction) is produced by alloying semiconductor material conducting by positive carriers (P material) to material conducting by negative carriers (N material), chemical etching is used to clear the junction perimeter of material which would otherwise electrically short the junction. In silicon wafers a direct current bias in the reverse direction is applied across the wafer so that the region of the junction is etched preferentially to the other parts of the wafer.

In the etching of semiconductor wafers under reverse bias, it is necessary to stop the etching at exactly the correct predetermined time. With insufficient etching of the junction, the junction is not cleared, resulting in poor reverse resistance. If the etching proceeds too long, the etched moat about the junction becomes so deep it adversely affects the mechanical strength of the alloyed wafer. In extreme cases, it would also increase the forward resistance by decreasing the junction area. It has been proposed to remove the wafers from the etching bath at timed intervals in the etching and subject the removed wafers to electrical tests in order to determine the correct stopping point for each wafer. This procedure is costly in terms of labor and time involved. It has also been proposed to exactly control the compositions of the wafers, etching bath, and the etching time and thereby set exact etching periods for each set of wafer and bath compositions. Such determinations however are necessarily inexact as extremely small variations in wafer and bath contaminants and in wafer size are of importance in etching time.

It is an object of the invention to provide new and improved methods of etching a semiconductor body having a PN junction.

It is another object of the invention to provide new and improved methods of etching a semiconductor body having a PN junction to remove shorting material from the junction while simultaneously monitoring the effect of the etching.

With the foregoing and other objects in mind, a method according to the invention may include immersing a semiconductor body having a PN junction in an etching bath, and applying a D.C. voltage having a magnitude substantially equal to the reverse breakdown of the junction across the junction in the reverse direction. Simultaneously, a low voltage, high frequency A.C. signal is applied across the junction. The frequency of this signal is such that the ionic carriers in the etchant do not respond thereto whereas the carriers in the semiconductor body do respond thereto. The high frequency response of the junction is recorded on an indicating means and the etching discontinued upon indication of a sharp voltage breakdown in the reverse direction.

In one embodiment, a variable D.C. reverse voltage is applied cyclically through input and output electrodes to the wafer for selective etching at the junction area, the D.C. voltage varying between values encompassing the reverse breakdown voltage of the junction. Through the same electrodes a low voltage high frequency alternating current of between eighteen megacycles per second and twenty-seven megacycles per second is applied to the wafer to monitor the etching. Prior to etching, excess material about the junction area shorts out the junction so that the wafer acts electrically as if there were no junction. Such a resistance permits increases in current with increases in voltage. When the excess material has been etched away the wafer acts electrically as a diode. In a diode having a reverse voltage applied thereto substantially no current flows until the voltage reaches the "zener" or "junction breakdown" value. When this value is exceeded the current increases rapidly with increases in voltage. The A.C. voltage drop across the junction is read on a meter such as a vacuum tube voltmeter or an oscilloscope. The etching is continued until the presence of a sharp voltage breakdown in the reverse direction is detected. When the presence of such a breakdown is detected, the unit is removed, either automatically or manually, from the etching bath.

Other objects and features of this invention will be apparent in the following detailed description and accompanying drawings in which.

Figure 1:
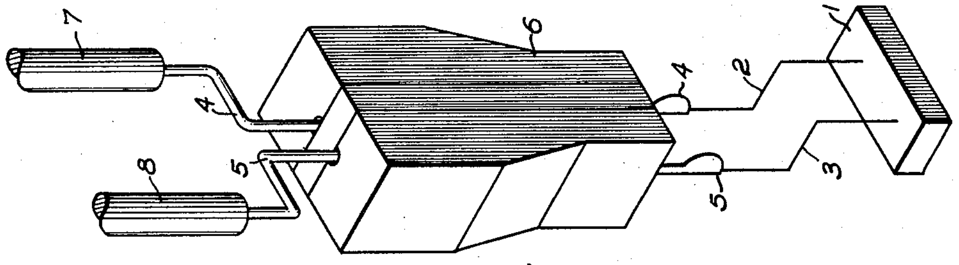
FIG. 1 is a perspective view of a holding fixture employed in carrying out the invention.

In FIG. 1 a semiconductor wafer 1 has contact wires 2 and 3 affixed to its top surface. These contact wires are connected respectively with the p and n type regions of the semiconductor wafer. Wires 2 and 3 are connected to leads 4 and 5 respectively which, after passing through holding fixture 6 are connected to electrical circuit output leads 7 and 8 respectively. In a particular example, wafer 1 is of silicon .025 inch thick, .05 inch wide and .085 inch long for use in a silicon diode, wire 2 is .01 inch diameter aluminum wire, wire 3 is of .01 inch diameter antimony doped gold wire, leads 4 and 5 are of gold plated nickel, and fixture 6 is of plastic.

The etching bath consists of one volume of 48% hydrofluoric acid and 9 volumes of propylene glycol. This solution etches a silicon wafer only when current is flowing through the wafer.

Figure 2:
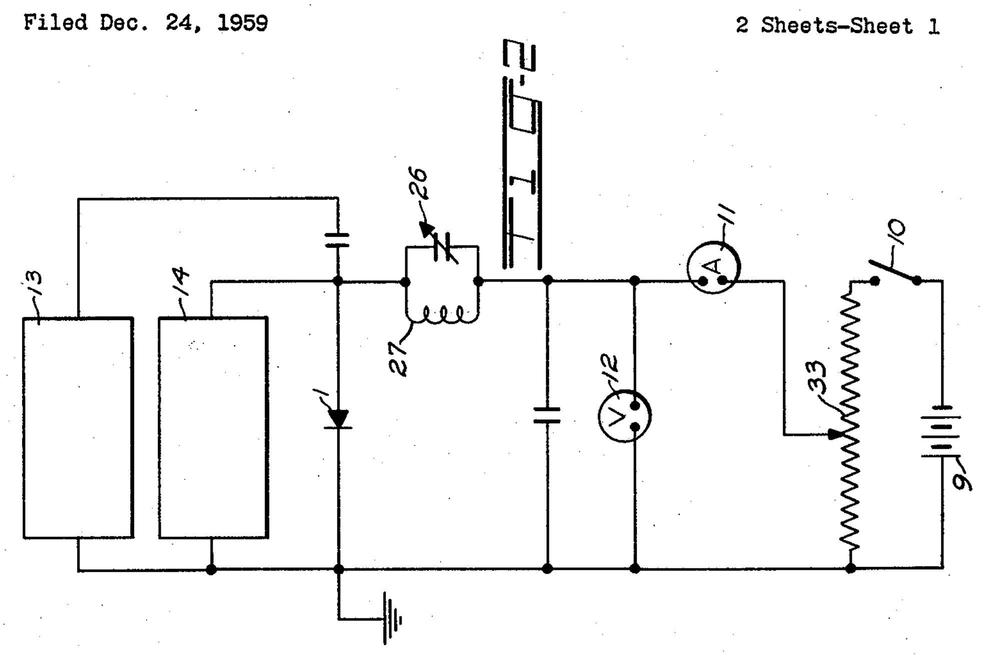
FIGS. 2 and 3 are schematic diagrams of electrical circuits employed in carrying out the invention.

In FIG. 2 wafer 1 is illustrated as a diode as it so performs electrically in that circuit. A source of D.C. electrical current 9 controlled by switch 10 is placed across wafer 1 in its reverse direction. For purposes of voltage control with source 9 of 90 volts D.C., ammeter 11 (150 milliamps) and voltmeter 12 (150 v.) and variable resistance 33 (5000 ohms) are connected between source 9 and wafer 1.

On closing switch 10 and immersing wafer 1 in the aforementioned etching solution the wafer will be etched preferentially in the neighborhood of the junction due to the bias current at that point. This etching is monitored by means of a low voltage high frequency A.C. source 13 and meter 14, both connected in parallel with wafer 1. In the simple circuit of FIG. 2 high frequency source 13 consists of a signal generator, of 300 ohm impedance, which generates waves at from eighteen megacycles per second to twenty seven megacycles per second. Meter 14 is a vacuum tube voltmeter.

This A.C. signal is confined to the A.C. portion of the circuit by turning adjustable capacitance 26, parallel to inductance 27, into resonance with the A.C. signal.

This simple circuit, though adequate where precision is not required, is not suitable for very precise measurements as the capacitance of the wafer varies with the bias voltage causing the resonance point to likewise vary with bias voltage. Another difficulty with this simple circuit is that D.C. bias changes must be made slowly so as to prevent their reception, by meter 14, as an A.C. component.

Figure 3:
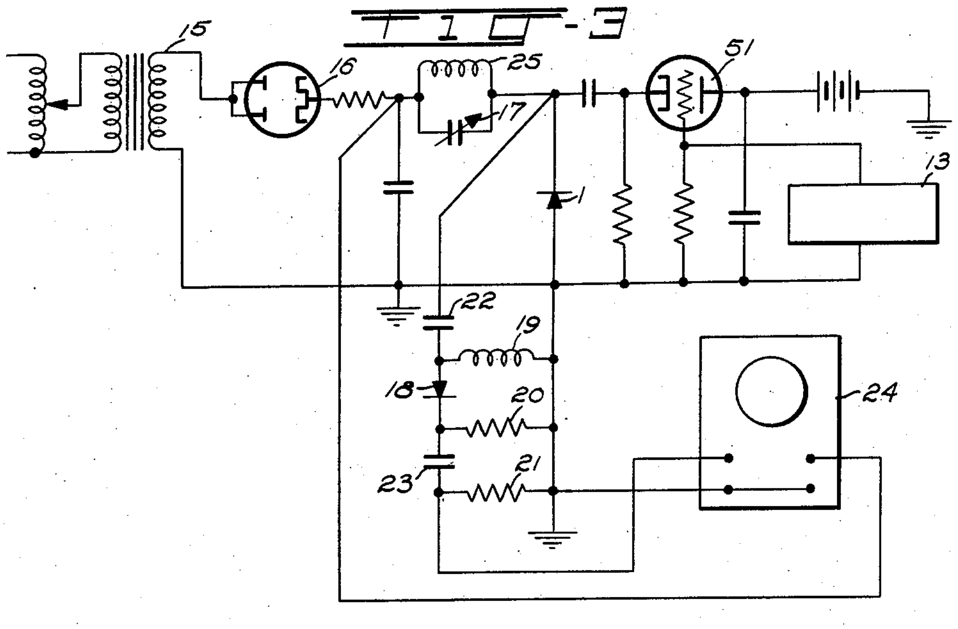

An improved circuit is shown in FIG. 3 in which input transformer 15 is connected to a 110 volt 60 cycle A.C. line. Double diode tube 16 provides a half-wave 60 cycle D.C. source, for biasing wafer 1, going from 0 volt to 250 volts and then back to 0 volt. Electron tube 51 and its associated cathode follower circuit provides a low impedance source so that tuning of the variable capacitor 17 need not be precise. The output of wafer 1 passes through a differentiating network comprising diode 18 inductance 19, resistances 20 and 21 and capacitors 22 and 23 to oscilloscope 24. As in the previous circuit the high frequency source 13 is isolated from the D.C. bias by being brought into resonance with the D.C. source by adjustable capacitor 17, which is in parallel with inductance 25.

Figure 4:
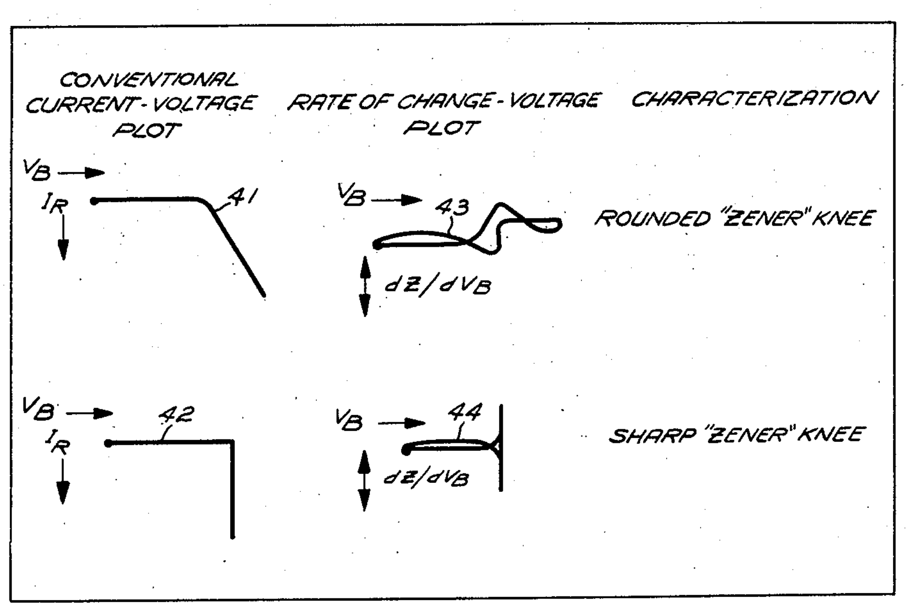
FIG. 4 illustrates wave shapes experienced with the circuit of FIG. 3.

FIG. 4 illustrates plots of voltage vs. current and voltage vs. voltage rate such as would be seen on oscilloscope 24. In plots 41 and 42 current is plotted against voltage for a rounded junction breakdown point and a sharp junction breakdown point respectively. In plots 43 and 44 voltage is plotted against the rate of change in voltage for rounded and sharp voltage breakdown points respectively. These plots are the same for a dry wafer and for a wafer immersed into an etching solution and also are the same when a D.C. current is applied across the wafer immersed in such solution.

Various modifications may be made in this invention without departing from the scope thereof.

What is claimed is:

1. The method of etching a semiconductor body having a PN junction to remove shorting material from said junction and simultaneously monitoring the effect of the etching on said body, which method comprises the steps of immersing and maintaining the body in an etching bath in such a manner that the junction is in contact with the etchant, applying a D.C. voltage of a magnitude substantially equal to the reverse breakdown voltage of the junction across said junction in the reverse direction to etch the body in the region of said junction, simultaneously applying a substantially lower voltage, high frequency A.C. signal across the junction, the frequency of said signal being of a value such that the ionic carriers in the etchant do not respond thereto whereas the carriers in the semiconductor body do respond thereto, recording the high frequency response to the junction on an indicating means, and discontinuing the etching on occurrence of a indication of a sharp voltage breakdown in the reverse direction.

2. A method according to claim 1, in which the frequency of the low voltage, high frequency signal is between 17 and 28 megacycles.

3. The method of etching a semiconductor body having a PN junction to remvoe shorting material from said junction and simultaneously monitoring the effect of the etching on said body, which method comprises the steps of immersing and maintaining the body in an etching bath in such a manner that the junction is in contact with the etchant, cyclically applying a time varying D.C. voltage in the reverse direction across the junction, said D.C. voltage varying between values encompassing the reverse breakdown voltage of the junction, simultaneously applying a low voltage, high frequency A.C. signal across the junction, the frequency of said signal being of a value such that the ionic carriers in the etchant do not respond thereto whereas the carriers in the semiconductor body do respond thereto, recording the high frequency response of the junction on an indicating means, and discontinuing the etching on occurrence of an indication of a sharp voltage breakdown in the reverse direction.

References Cited by the Examiner

UNITED STATES PATENTS

| | | | |
|---|---|---|---|
| 2,364,501 | 12/44 | Wolfskill | 41—42 |
| 2,602,763 | 7/52 | Scaff et al. | 204—143 |
| 2,656,496 | 10/53 | Sparks | 204—143 |
| 2,755,536 | 7/56 | Dickinson | 29—25.3 |
| 2,783,197 | 2/57 | Herbert | 204—143 |
| 2,808,523 | 10/57 | Holmbeck | 204—298 |
| 2,940,024 | 6/60 | Kurshan | 204—143 |
| 2,963,411 | 12/60 | Scott | 204—143 |
| 2,975,342 | 3/61 | Rediker | 204—143 |
| 2,979,444 | 4/61 | Tiley | 204—143 |
| 3,081,418 | 3/63 | Manintveld et al. | 204—143 |

FOREIGN PATENTS

| | | |
|---|---|---|
| 761,795 | 11/56 | Great Britain. |
| 1,131,213 | 10/56 | France. |

JOHN H. MACK, *Primary Examiner.*